(12) United States Patent
Sun

(10) Patent No.: US 9,553,196 B2
(45) Date of Patent: Jan. 24, 2017

(54) MULTI-GATE THIN FILM TRANSISTOR, ARRAY SUBSTRATE AND DISPLAY DEVICE

(71) Applicant: BOE TECHNOLOGY GROUP CO., LTD., Beijing (CN)

(72) Inventor: Tuo Sun, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 34 days.

(21) Appl. No.: 14/445,549

(22) Filed: Jul. 29, 2014

(65) Prior Publication Data

US 2015/0280008 A1    Oct. 1, 2015

(30) Foreign Application Priority Data

Mar. 27, 2014  (CN) .......................... 2014 1 0120804

(51) Int. Cl.
  *H01L 29/786*    (2006.01)
  *H01L 29/423*    (2006.01)

(52) U.S. Cl.
  CPC ... *H01L 29/78645* (2013.01); *H01L 29/42384* (2013.01); *H01L 29/78696* (2013.01)

(58) Field of Classification Search
  None
  See application file for complete search history.

(56) References Cited

U.S. PATENT DOCUMENTS

| | | | |
|---|---|---|---|
| 7,091,938 B2 * | 8/2006 | Inukai | G09G 3/3241 345/76 |
| 7,154,117 B2 * | 12/2006 | Segawa | G02F 1/136227 257/350 |
| 7,612,379 B2 * | 11/2009 | Morimoto | H01L 29/78612 257/66 |

(Continued)

FOREIGN PATENT DOCUMENTS

| | | |
|---|---|---|
| CN | 1448902 A | 10/2003 |
| CN | 101053005 A | 10/2007 |

(Continued)

OTHER PUBLICATIONS

Definition of 'independence' downloaded from URL<http://www.merriam-webster.com/dictionary/independent> on May 6, 2016.*

(Continued)

*Primary Examiner* — Joseph Schoenholtz
(74) *Attorney, Agent, or Firm* — Nath, Goldberg & Meyer; Joshua B. Goldberg; Leonid D. Thenor

(57) ABSTRACT

The present invention discloses a multi-gate thin film transistor for realizing a multi-gate occupying a small area, pixels provided with the multi-gate TFTs are high in aperture ratio, and a display device provided with the multi-gate TFTs is high in resolution. The multi-gate thin film transistor comprises: at least three gate electrodes; a plurality of active layers corresponding to each of the gate electrodes, respectively, the active layers being formed into an integrated structure; a source electrode connected with one of the plurality of active layers; and a plurality of drain electrodes (Continued)

connected with each of the remainder of the plurality of active layers, respectively. The present invention further discloses an array substrate comprising the multi-gate thin film transistor, and a display device.

9 Claims, 5 Drawing Sheets

(56) References Cited

U.S. PATENT DOCUMENTS

| | | | |
|---|---|---|---|
| 8,674,346 B2* | 3/2014 | Shin | H01L 27/3265 257/40 |
| 2001/0000627 A1* | 5/2001 | Hayakawa | G02F 1/1368 257/347 |
| 2003/0066740 A1* | 4/2003 | Inukai | G09G 3/325 200/11 D |
| 2009/0263941 A1* | 10/2009 | Lee | H01L 29/42384 438/151 |
| 2010/0238095 A1* | 9/2010 | Zhang | H01L 27/0266 345/82 |
| 2012/0069259 A1* | 3/2012 | Oh | H01L 27/1214 349/43 |
| 2012/0175605 A1* | 7/2012 | Shin | H01L 27/3265 257/43 |
| 2012/0175627 A1* | 7/2012 | Sun | H01L 27/12 257/72 |
| 2013/0001581 A1* | 1/2013 | Ohtani | G02F 1/136209 257/72 |

FOREIGN PATENT DOCUMENTS

| | | |
|---|---|---|
| CN | 101950746 A | 1/2011 |
| CN | 102411240 A | 4/2012 |
| CN | 102914928 A | 2/2013 |
| CN | 102916051 A | 2/2013 |

OTHER PUBLICATIONS

1st office action issued in Chinese application No. 201410120804.5 dated Feb. 24, 2016.

* cited by examiner

MULTI-GATE THIN FILM TRANSISTOR, ARRAY SUBSTRATE AND DISPLAY DEVICE

FIELD OF THE INVENTION

The present invention relates to the field of display technology, in particular to a multi-gate thin film transistor, an array substrate and a display device.

BACKGROUND OF THE INVENTION

In the field of liquid crystal display (LCD) technology or the field of organic light emitting display (OLED) technology a thin film transistor (TFT) is used as a switch for charging and discharging a pixel unit, and the magnitude of the leakage current thereof is one of the important parameters influencing the performance of a liquid crystal screen.

In the prior art, an amorphous silicon (a-Si) material with good stability and processability has always been used in the active layer of the TFT, however, the carrier mobility of the a-Si material is low and incapable of meeting the requirements of a display device with large dimensions and high resolution, and in particular, incapable of meeting the requirements of the next generation of active matrix organic light emitting device (AMOLED). Compared with an amorphous silicon (a-Si) thin film transistor, a polycrystalline silicon TFT, in particular, a low-temperature polycrystalline silicon TFT, is higher in electron mobility and lower in leakage current, and gradually rep laces the amorphous silicon thin film transistor and becomes the mainstream of thin film transistors already.

In an existing preparation technology of a low-temperature polycrystalline silicon thin film transistor, a source electrode and a drain electrode are formed by doping, that is, the source electrode, the drain electrode and an active layer are located in the same layer.

A common low-temperature polycrystalline silicon TFT is a single-gate TFT, that is, one TFT has one gate electrode, one active layer, one source electrode and one drain electrode, in order to reduce the leakage current of the single-gate TFT, a double-gate TFT structure has been proposed in the prior art, that is, two TFTs are serially connected to form a double-gate TFT, which have two gate electrodes, one source electrode, one drain electrode and two electrically-connected active layers. The leakage current of the double-gate TFT in a turned-off state is 1-2 orders of magnitudes less than that of a single-gate TFT with the same width-length ratio. However, the occupied area of the double-grid TFT on a display substrate is larger than that of the single-grid TFT, which influences the aperture ratio of pixels of a display device, and is adverse to realize a high-resolution (high-PPI) display product.

Specifically, for a liquid crystal display device, one double-gate TFT is provided in each sub-pixel. For an organic light emitting display device, a plurality of single-gate TFTs and/or double-gate TFTs are provided in each pixel, and the single-gate TFTs and/or the double-gate TFTs form a driving circuit used for driving the OLED to emit light. The aperture ratio of pixels is low, and it is difficult to manufacture a high-PPI liquid crystal display device.

The pixels in the liquid crystal display device are taken as an example for description, and FIG. 1 shows a double-gate TFT structure in an pixel in a liquid crystal display device in the prior art. Referring to FIG. 1, the double-gate TFT structure comprises two double-gate TFTs 20 connected to the same gate line 10, and each of the double-gate TFTs is used as a charge-discharge switch for its corresponding pixel. Each of the double-gate TFTs 20 comprises: a first gate electrode 201 and a second gate electrode 202 which are connected with the gate line 10, respectively; and a first active layer 203 and a second active layer 204 which correspond to the first gate electrode 201 and the second gate electrode 202, respectively, wherein the first active layer 203 and the second active layer 204 are electrically connected through a connection layer 205, and the first active layer 203 and the second active layer 204 are distributed in a straight-line shape.

Because the two double-gate TFTs 20 share the gate line 10, regardless of whether the two double-gate TFTs 20 share a data line 30, the double-gate TFTs occupy large areas, thus resulting in low aperture ratio of pixels.

Referring to FIG. 1, when the two double-gate TFTs 20 share the data line 30, because the connection point (point b) where the data line 30 and the two double-gate TFTs 20 are connected exists, the line width at a position (point a) on the gate line 10 adjacent to the point b is reduced, thus resulting in a risk of line breakage of the gate line 10.

SUMMARY OF THE INVENTION

The present invention provides a multi-gate thin film transistor for realizing a multi-gate TFT occupying a small area, pixels provided with the multi-gate TFTs are high in aperture ratio, and a display device provided with the multi-gate TFTs is high in resolution. The present invention further provides an array substrate comprising the multi-gate thin film transistors, and a display device.

An aspect of the present invention provides a multi-gate thin film transistor, comprising: at least three gate electrodes; a plurality of active layers corresponding to each of the gate electrodes, respectively, the active layers being formed into an integrated structure; a source electrode connected with one of the plurality of active layers; and a plurality of drain electrodes con fleeted with each of the rest of the plurality of active layers, respectively.

According to an embodiment of the present invention, the at least three gate electrodes comprise a first gate electrode, a second gate electrode and a third gate electrode, and the plurality of active layers comprise a first active layer, a second active layer and a third active layer corresponding to the first gate electrode, the second gate electrode and the third gate electrode, respectively.

According to an embodiment of the present invention, the first active layer, the second active layer and the third active layer form a T-Shaped structure or a Y-shaped structure, and the first gate electrode, the second gate electrode and the third gate electrode form a U-shaped structure.

According to an embodiment of the present invention, the first gate electrode, the second gate electrode and the third gate electrode form a T-shaped structure or a Y-shaped structure, and the first active layer, the second active layer and the third active layer form a U-shaped structure.

According to an embodiment of the present invention, the at least three gate electrodes further comprise a fourth gate electrode, and the plurality of active layers further comprise a fourth active layer corresponding to the fourth gate electrode.

According to an embodiment of the present invention, the first gate electrode, the second gate electrode, the third gate electrode and the fourth gate electrode form a square structure, and the first active layer, the second active layer, the third active layer and the fourth active layer form a cross-shaped structure.

According to an embodiment of the present invention, the first active layer, the second active layer, the third active layer and the fourth active layer form a square structure, and the first gate electrode, the second gate electrode, the third gate electrode and the fourth gate electrode form a cross-shaped structure.

Another aspect of the present invention provides an array substrate comprising the multi-gate thin film transistor according to the present invention.

According to an embodiment of the present invention, the array substrate further comprises a plurality of gate lines, a plurality of data lines and a plurality of pixel units provided with pixel electrode, wherein one data line is arranged between every two adjacent rows of pixel units. The multi-gate thin film transistor is located between at least two adjacent pixel units, each of the gate electrodes in the multi-gate thin film transistor is connected with the same gate line, the source electrode is connected with the data line, and each of the drain electrodes is connected with the pixel electrode of each of the at least two adjacent pixel units, respectively.

According to an embodiment of the present invention, each of the gate electrodes, each of the active layers and each of the drain electrodes in the multi-gate thin film transistor are located at the same side of the gate line connected with each of the gate electrodes, and the source electrode in the multi-gate thin film transistor is located at the other side of the gate line.

Still another aspect of the present invention provides a display device comprising the array substrate according to the present invention.

In the multi-gate TFT according to the present invention, because the active layers are formed into the integrated structure, when the multi-gate TFT is turned on, a channel formed by each of the active layers is shared, thus the multi-gate TFT may function as at least two double-gate thin film transistors, and moreover, the multi-gate TFT is simple in structure and small in occupied area. In the array substrate and the display device according to the present invention, because the multi-gate TFT according to the present invention is comprised, the areas of the pixels are smaller and the resolution PPI of the display device is higher on the premise of a fixed aperture ratio of pixels; in addition, the aperture ratio of pixels is higher, and the display effect is better on the premise of a fixed resolution of the display device.

The multi-gate TFT according to the present invention may replace at least three single-gate TFTs sharing a gate line and a data line, or may replace at least two double-gate TFTs sharing a gate line and a data line.

BRIEF DESCRIPTION OF THE DRAWINGS

FIG. 4 shows a flow direction of a current in a channel after the multi-gate TFT shown in FIG. 2 is turned on;

DETAILED DESCRIPTION OF THE EMBODIMENTS

The technical solution of each embodiment of the present invention will be described in detail below with reference to the accompanying drawings.

Figure 1:
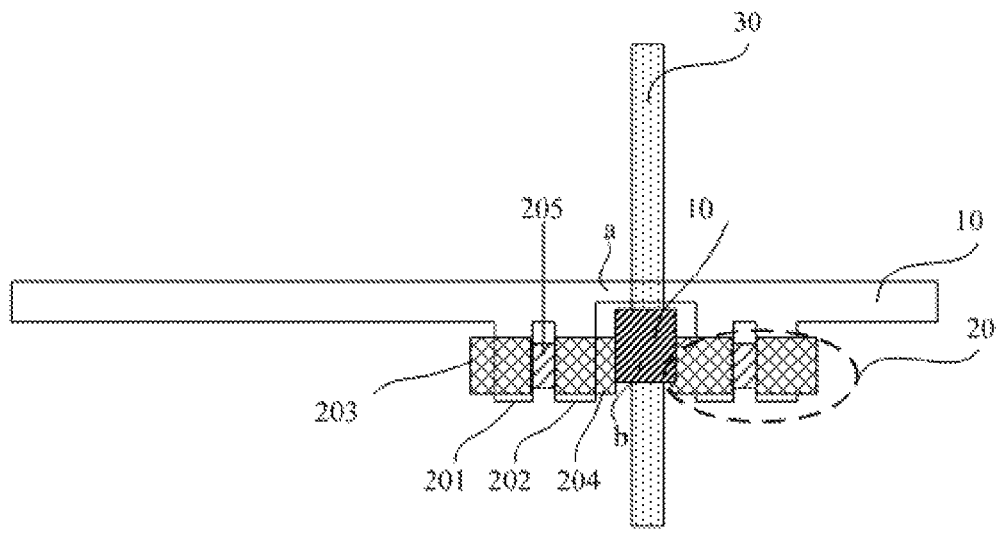
FIG. 1 is a schematic diagram of a structure of a double-gate TFT in a pixel in a liquid crystal display device in the prior art.
Figure 2:
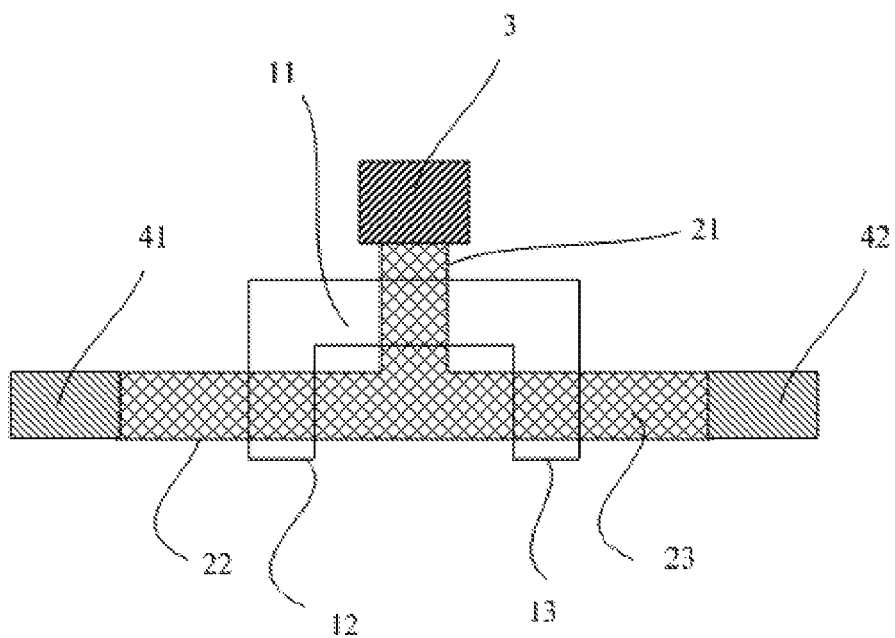
FIG. 2 is a schematic diagram of a structure of a multi-gate TFT according to an embodiment of the present invention.
Figure 3:
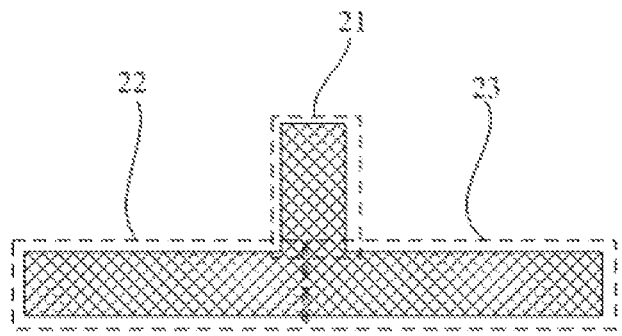
FIG. 3 is a schematic diagram of a structure of a first active layer, a second active layer and a third active layer in the integrated structure shown in FIG. 2.
Figure 4:
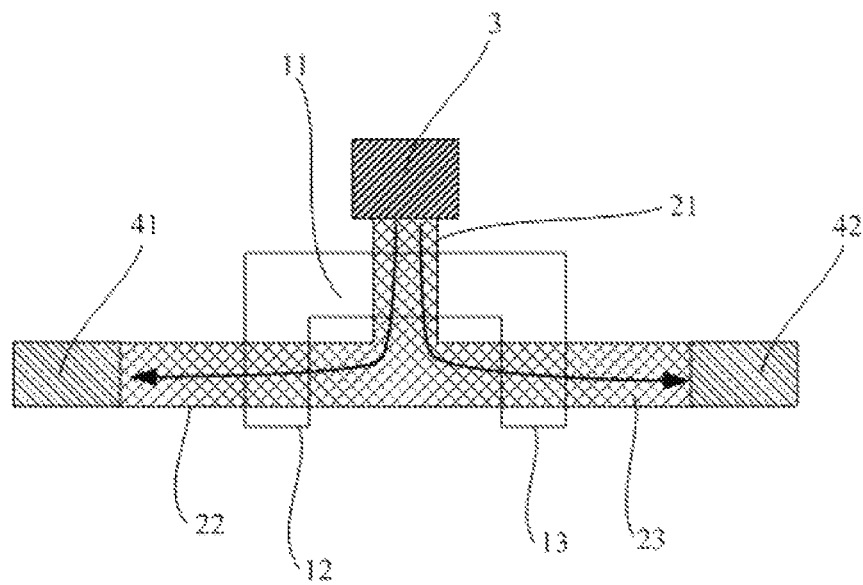

FIG. 2 is a schematic diagram of a structure of a multi-gate TFT according to an embodiment of the present invention. FIG. 3 is a schematic diagram of a structure of a first active layer, a second active layer and a third active layer in the integrated structure shown in FIG. 2, and FIG. 4 shows a flow direction of a current in a channel after the multi-gate shown in FIG. 2 is turned on.

Referring to FIG. 2, the multi-gate TFT according to the embodiment comprises: a first gate electrode 11, a second gate electrode 12 and a third gate electrode 13; and a first active layer 21, as second active layer 22 and a third active layer 23 which correspond to the first gate electrode 11, the second gate electrode 12 and the third gate electrode 13, respectively, the first active layer 21, the second active layer 22 and the third active layer 23 being formed into an integrated structure. In addition, the multi-gate TFT further comprises a source electrode 3 connected with the first active layer 21, and a first drain electrode 41 and a second drain electrode 42 which are connected with the second active layer 22 and the third active layer 23, respectively.

The multi-gate TFT according to the embodiment further comprises a gate insulation layer for insulating each of the gate electrodes from the source electrode, the drain electrodes and the active layers. The multi-gate TFT according to the embodiment may be a low-temperature polycrystalline silicon thin film transistor. Generally, a source electrode and a drain electrode in the low-temperature polycrystalline silicon thin film transistor are high-conductivity areas obtained by doping on a polycrystalline silicon layer, and the portion of the polycrystalline silicon layer between the source electrode and the drain electrode is an active layer. Therefore, the source electrode, the drain electrodes and the active layers are located in the same layer, and the gate electrodes are located in a layer different from the layer where the source electrode, the drain electrodes and the active layers are located.

It should be noted that, the first active layer 21, the second active layer 22 and the third active layer 23 in the multi-gate TFT according to the embodiment are formed into an integrated structure. FIG. 3 is a schematic diagram of a structure of the first active layer 21, the second active layer 22 and the third active layer 23 in the integrated structure shown in FIG. 2. Referring to FIG. 3, areas defined by respective closed dotted line correspond to the first active layer 21, the second active layer 22 and the third active layer 23, respectively. The integrated structure may be understood in such a way that no interface, no connection layer or no connection line is formed among the first active layer 21, the second active layer 22 and the third active layer 23. When the multi-gate TFT is turned on (that is, a turned-on voltage is applied to the first gate electrode, the second gate electrode and the third gate electrode simultaneously), the channel formed by the first active layer 21, the second active layer 22 and the third active layer 23 is a shared-channel.

As shown in FIG. 4, a curve with an a now indicates the flow direction of a current in the channel after the multi-gate TFT is turned on. Because the source electrode 3 is connected with the first active layer 21 and the first drain electrode 41 is connected with the second active layer 22, when the multi-gate TFT is turned on, the source electrode 3 is conducted with the first drain electrode 41 by the current in the channel formed by the first active layer 21 and the second active layer 22. Therefore, the source electrode 3, the first drain electrode 41, the first active layer 21 and the second active layer 22, and the first gate electrode 11 and the second gate electrode 12 may be equivalent to a double-gate TFT.

Similarly, the source electrode 3, the second drain electrode 42, the first active layer 21 and the third active layer 23, and the first gate electrode 11 and the third gate electrode 13 may be equivalent to another double-gate TFT.

That is, the multi-gate TFT according to the embodiment may be equivalent to two double-gate TFTs sharing a gate line and a data line. In addition, when the multi-gate TFT shown in FIG. 4 is turned off, because the second active layer 22 and the third active layer 23 exist between the first drain electrode 41 and the second drain electrode 42, the phenomenon of sign crosstalk is avoided between the first drain electrode 41 and the second drain electrode 42 of the multi-gate TFT.

In the multi-gate TFT according to the embodiment, because the first active layer, the second active layer and the third active layer are formed into the integrated structure, each of the active layers and each of the gate electrodes arranged above (or below) each of the active layers may be in ore compact structurally, thus occupy smaller areas on a substrate, and the aperture ratio of the TFT may be further increased in the pixel area of the display device.

For example, the integrated structure formed by the first active layer, the second active layer and the third active layer may be set into a curve-shaped structure, so as to reduce the covering area of the multi-gate TFT on the substrate.

Correspondingly, the first gate electrode, the second gate electrode and the third gate electrode may be set into structures corresponding to the first active layer, the second active layer and the third active layer of the integrated structure.

In the embodiment shown in FIG. 2, the first gate electrode 11, the second gate electrode 12 and the third gate electrode 13 are formed into an integrated U-shaped structure. The first gate electrode 11 may be the bottom of the U-shaped structure, and the second gate electrode 12 and the third gate electrode 13 may be the two side parts of the U-shaped structure, respectively. In addition, the first active layer 21, the second active layer 22 and the third active layer 23 are formed into an integrated T-shaped structure. The first active layer 21 may be the longitudinal part in the T-shaped structure, and the second active layer 22 and the third active layer 23 may be located on the same straight line, forming the transversal part in the T-shaped structure.

In the embodiment shown in FIG. 2, the first active layer 21 corresponds to the first gate electrode 11, the second active layer 22 corresponds to the second gate electrode 12, and the third active layer 23 corresponds to the third gate electrode 13. Here, the first gate electrode 11, the second gate electrode 12 and the third gate electrode 13 are formed into a U-shaped structure, the first active layer 21, the second active layer 22 and the third active layer 23 are formed into a T-shaped structure, and an overlapping area exists between the U-shaped structure and the T-shaped structure. Compared with the arrangement, in which two double-gate TFTs share a gate electrode and a data line, in the prior art, the multi-gate TFT shown in FIG. 2 has a smaller overall structure, that is, covers a smaller area on the substrate, thus the areas of the pixels are smaller and the resolution PPI of the display device is higher on the premise of a fixed aperture ratio of the pixels; in addition, the aperture ratio of the pixels is higher, and the display effect is better on the premise of a fixed resolution of the display device.

Figure 5:
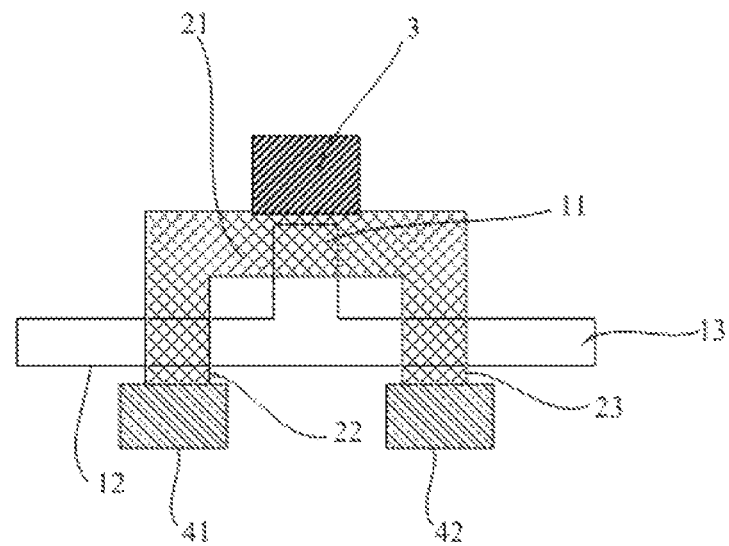
FIG. 5 is a schematic diagram of a structure of a multi-gate TFT according to another embodiment of the present invention.

FIG. 5 is a schematic diagram of a structure of a multi-gate TFT according to another embodiment of the present invention. This embodiment differs from the embodiment shown in FIG. 2 in that, the first active layer 21, the second active layer 22 and the third active layer 23 are formed into a U-shaped structure, and the first gate electrode 11, the second gate electrode 12 and the third gate electrode 13 are formed into a T-shaped structure. Here, the first active layer 21 may be the bottom of the U-shaped structure, and the second active layer 22 and the third active layer 23 may be the two side parts of the U-shaped structure, respectively; the first gate electrode 11 may be the longitudinal part in the T-shaped structure, and the second gate electrode 12 and the third gate electrode 13 may be located on the same straight line forming the transversal part in the T-shaped structure.

It should be noted that, the embodiments shown in FIG. 2 and FIG. 5 are merely exemplary, and the multi-gate TFT according to the present invention is not limited to the above two implementations. For example, each of the active layers and/or each of the gate electrodes may be formed into various transformations of the T-shaped structure and/or the U-shaped structure. For example, the T-shaped structure may be transformed into an upward-arrow-shaped structure or a Y-shaped structure.

In the embodiment shown in FIG. 2, the included angle between the first gate electrode 11 and the second gate electrode 12 or between the first gate electrode 11 and the third gate electrode 13 is about 90 degrees, but the present invention is not limited thereto, for example, the included angle may range from 30 degrees to 90 degrees. In addition, in FIG. 2, the second active layer 22 and the third active layer 23 are shown on a straight line, but the present invention is not limited thereto, that is, a certain included angle may be formed between the second active layer 22 and the third active layer 23 according to actual needs.

It should be appreciated that, various modifications made to the above structures of the multi-gate TFTs shown in FIGS. 2 and 5 are within the protect on scope of the present invention.

Figure 6:
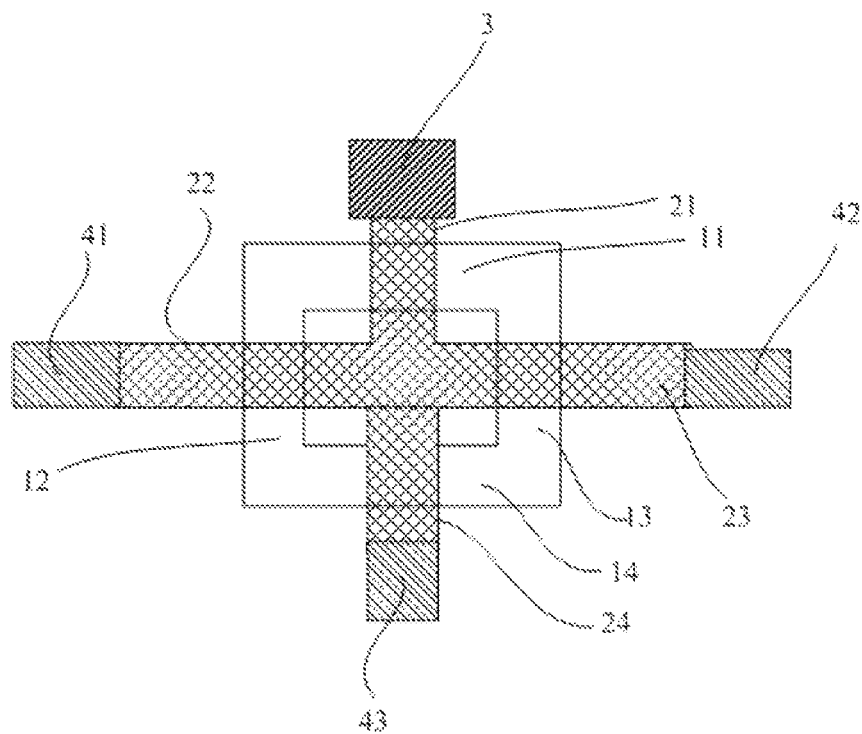
FIG. 6 is a schematic diagram of a structure of a multi-gate TFT according to still another embodiment of the present invention.

FIG. 6 is a schematic diagram of a structure of a multi-gate TFT structure according to still another embodiment of the present invention. This embodiment differs from the embodiment shown in FIG. 2 in that, the multi-gate TFT shown in FIG. 6 further comprises a fourth gate electrode 14, a fourth active layer 24 corresponding to the fourth gate electrode 14, and a third drain electrode 43 connected with the fourth active layer 24.

In a LCD display device, the first drain electrode 41, the second drain electrode 42 and the third drain electrode 43 may be connected with pixel electrodes in three pixels, respectively. In an OLED display device, the first drain electrode 41, the second drain electrode 42 and the third drain electrode 43 may be connected with three other TFT structures or light emitting devices OLEDs, respectively.

Similar to the embodiment shown in FIG. 2, because the source electrode 3 is connected with the first active layer 21, the first drain electrode 41 is connected with the second active layer 22, the second drain electrode 42 is connected with the third active layer 23 and the third drain electrode 43 is connected with the fourth active layer 24, when the multi-gate TFT is turned on, the source electrode 3 is conducted with the first drain electrode 41 by a current in the channel formed by the first active layer 21 and the second active layer 22, the source electrode 3 is conducted with the second drain electrode 42 by a current in the channel formed by the first active layer 21 and the third active layer 23, and the source electrode 3 is conducted with the third drain electrode 43 by a current in the channel formed by the first active layer 21 and the fourth active layer 24. A structure between the source electrode 3 and each of the drain electrodes is equivalent to a double-gate TFT, therefore, the multi-gate TFT according to the embodiment may be equivalent to three double-gate thin film transistors sharing a gate line and a data line.

In the embodiment shown in FIG. 6, the first gate electrode 11, the second gate electrode 12, the third gate electrode 13 and the fourth gate electrode 14 form a square structure, and the first active layer 21, the second active layer 22, the third active layer 23 and the fourth active layer 24 form a cross-shaped structure.

Figure 7:
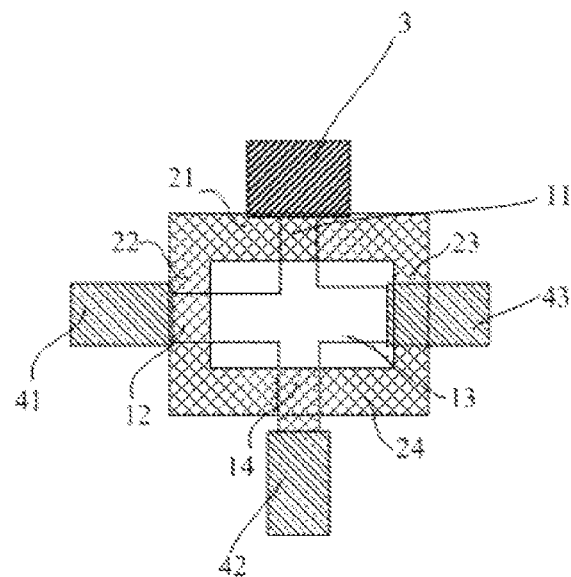
FIG. 7 is a schematic diagram of a structure of a multi-gate TFT according to another embodiment of the present invention.

FIG. 7 is a schematic diagram of a structure of a multi-gate TFT according to another embodiment of the present invention. The embodiment differs from the embodiment shown in FIG. 6 in that, the first gate electrode 11, the second gate electrode 12, the third gate electrode 13 and the fourth gate electrode 14 form a cross-shaped structure, and the first active layer 21, the second active layer 22, the third active layer 23 and the fourth active layer 24 form a square structure.

It should be noted that, the embodiments shown in FIGS. 6 and 7 are merely exemplary, and the multi-gate TFT according to the present invention is not limited to the above two implementations. For example, each of the active layers and/or each of the gate electrodes may be formed into various transformations of the square structure and/or the cross-shaped structure. It should be appreciated that, various modifications made to the above structures of the multi-gate TFTs shown in FIGS. 6 and 7 are with in the protection scope of the present invention.

According to the embodiments of the present invention, each of the gate electrodes may be located in the same layer, whereas the source electrode, each of the drain electrodes and each of the active layers may be located in a layer different from the layer where each of the gate electrodes is located, and a gate insulation layer may be provided between each of the gate electrodes and the source electrode, each of the drain electrodes and each of the active layers.

The gate electrodes may be located above the source electrode, each of the drain electrodes and each of the active layers to form a top-gate type structure, or may be located below the source electrode, each of the drain electrodes and each of the active layers to form a bottom-gate type structure.

In the accompanying drawings, the gate insulation layer is not shown, and the upper-and-lower position relationship between the gate electrodes and the source electrode, each of the drain electrodes and each of the active layers is also not specifically shown. The present invention intends to protect various modifications which may be made based on the embodiments shown in the drawings.

In order to describe the charging characteristic of a multi-gate TFT according to an embodiment of the present invention while being turned on and the holding characteristic of the multi-gate TFT while being turned off, the charging characteristic and the voltage holding characteristic, of the multi-gate TFT are simulated in the present invention.

For the charging characteristic of the multi-gate TFT while being turned on, the charging characteristics of the double-gate TFT sharing the channel in the embodiment of the present invention and the double-gate TFT in the prior art are simulated.

Figure 8:
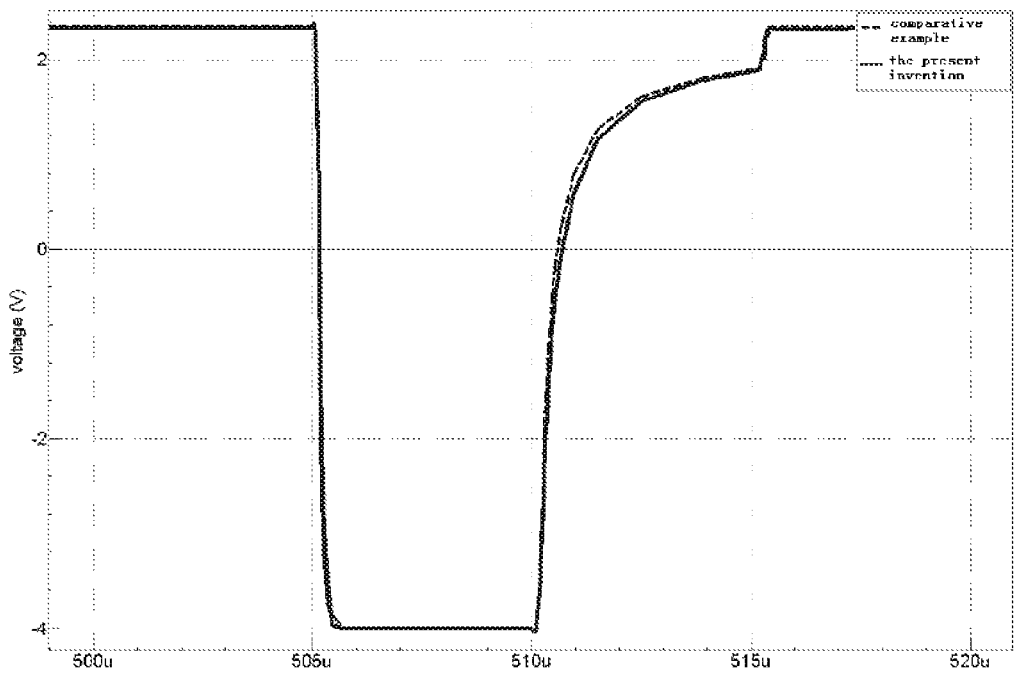
FIG. 8 shows simulated results of the charging characteristics of the multi-gate TFT according to an embodiment of the present invention and a TFT according to a comparative example.

FIG. 8 is curve diagram illustrating a time-voltage relationship of the multi-gate TFT according to an embodiment of the present invention in a turned-on phase, referring to FIG. 8, a solid line indicates the change curve of the signal voltage of the multi-gate TFT according to the embodiment of the present invention with time, dotted line indicates the change curve of the signal voltage of the double-gate TFT, which does not share a channel in a comparison embodiment, with time. The solid line and the dotted line nearly coincide, which indicates that the structure of the multi-gate TFT sharing the channel according to the embodiment of the present invention has no adverse influence on the charge effect while being turned on. The change trend of the signal voltage during a process of controlling charge of the pixels, of the multi-gate TFT, meets a curve corresponding to an ideal TFT charging characteristic.

Figure 9:
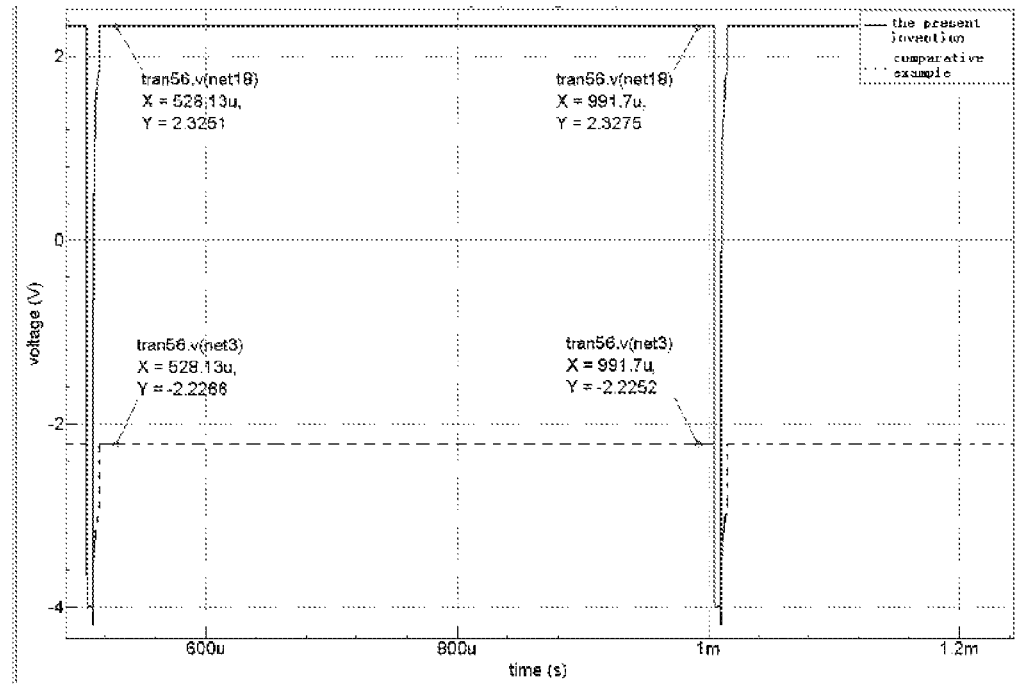
FIG. 9 shows simulated results of the holding characteristics of the multi-gate TFT according to an embodiment of the present invention and a TFT according to a comparative example.

For the charging characteristic of the multi-gate TFT while being turned off, voltages are applied to the first drain electrode and the second drain electrode of the multi-gate TFT according to the embodiment of the present invention, respectively, so as to test the voltage holding characteristic. FIG. 9 shows a simulated results of the holding characteristics of the multi-gate TFT according to the embodiment of the present invention and a TFT according to a comparative example. From FIG. 9, it can be known that, the voltage value of the multi-gate TFT according to the embodiment of the present invention keeps constant, and no electric leakage phenomenon occurs, which indicates that the voltages of the first drain electrode and the second drain electrode are not mutually influenced, and also indicates that the charging characteristic of the multi-gate TFT while being turned off is good.

Figure 10:
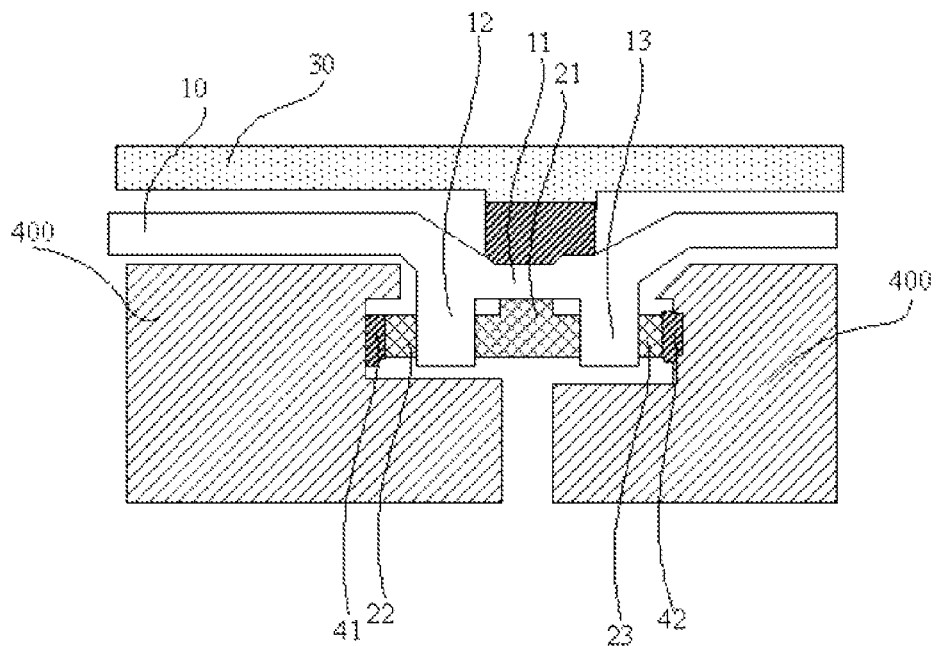
FIG. 10 is a schematic diagram of a structure of an array substrate according to an embodiment of the present invention.

FIG. 10 is a schematic diagram of a structure of an array substrate according to an embodiment of the present invention. Referring to FIG. 10, the array substrate comprises the multi-gate TFT according to an embodiment of the present invention, and the multi-gate TFT has a structure in which a channel is shared between two double-gate TFTs or among a plurality of double-gate TFTs. For example, the multi-gate TFT may be realized as any one of the multi-gate TFTs shown in FIG. 2 and FIGS. 5 to 7.

Generally, the multi-gate TFT may be provided between two or more adjacent pixels on the array substrate of the liquid crystal display device as a switch for charging and discharging two or more pixels simultaneously. In addition, the multi-gate TFT may also be provided in a gate driving circuit (in particular, a gate driver on array (GOA) circuit), so as to realize a multi-gate TFT design in which a gate line and a data line are shared. In addition the multi-gate TFT may also be provided in a pixel driving circuit of a display substrate in an organic light emitting display device.

Referring to FIG. 10, the illustrated array substrate may comprise a plurality of gate lines 10, a plurality of data lines 30 and a plurality of pixel units provided with pixel electrode 400 (only one gate line 10, one data line 30 and two pixel units provided with pixel electrode 400 are shown in FIG. 10). One data line 30 is provided between every two adjacent rows of pixel units (the pixel units herein are sub pixel units or sub-pixel units). The multi-gate TFT according to an embodiment of the present invention is located between at least two adjacent pixel units, each of the gate electrodes in the multi-gate TFT is connected with the same gate line 10, the source electrode is connected with the data line 30, and each of the drain electrodes is connected with the pixel electrode 400 of each of the two adjacent pixel units, respectively. Although the array sub state shown in FIG. 10 comprises the multi-gate TFT shown in FIG. 2, the present invention is not limited thereto. The array substrate shown in FIG. 10 is described below by merely taking the multi-gate TFT shown in FIG. 2 as an example.

The first gate electrode 11, the second gate electrode 12 and the third gate electrode 13 of the multi-gate TFT are connected to the same gate line 10, the source electrode 3 of the multi-gate TFT is connected to the data line 30 shared between the two adjacent pixel units, and the first drain electrode 41 and the second drain electrode 42 of the multi-gate TFT are connected with the pixel electrodes 400 in the two pixel units, respectively. The multi-gate TFT is used as a switch for charging and discharging the two pixel electrodes 400, and the pixel electrodes 400 in the two pixel units may be charged simultaneously while the multi-gate TFT is turned on.

Generally, the gate line 10 is located between two rows of pixel units, so as to provide a gate voltage to the multi-gate TFT between the adjacent pixel units in the next row of pixel units, and is connected with the first gate electrode 11, the second gate electrode 12 and the third gate electrode 13 of the multi-gate TFT.

According to an embodiment of the present invention, each of the gate electrodes, each of the active layers and each of the drain electrodes in the multi-gate TFT are located at the same side of the gate line connected with each of the gate electrodes, and the source electrode in the multi-gate TFT is located at the other side of the gate line, so as to avoid adverse influence on a line width design for the gate line due to that the source electrode in the multi-gate TFT is provided between the gate line and the active layers, and thus avoiding line breakage due to that a part of gate line is too thin. According to such arrangement, the source electrode of the multi-gate TFT and the other structures of the multi-gate TFT may be arranged at both sides of the gate line, respectively, that is, the source electrode is provided between the gate line and the previous row of pixel units. A space between the previous row of pixel units and the gate line is relatively large, thus the design with a normal line width for the gate line is not influenced, so as to avoid the problem of the line breakage due to that a part of the gate line has a too small width.

The multi-gate TFTs and/or the array substrates according to the embodiments of the present invention may be applied to various display devices. The display devices comprise (but not limited to) display devices such as liquid crystal displays, liquid crystal televisions, liquid crystal display panels, organic light emitting display panels, flexible electronic paper and the like.

Although the embodiments of the present invention have been shown and described, for those skilled in the art, various modifications and variations could be made to the embodiments of the present invention without departing from the spirit and scope of the present invention. Therefore, the present invention intends to cover these modifications and variations.

The invention claimed is:

1. A multi-gate thin film transistor, comprising:
at least three gate electrodes;
a plurality of active layers corresponding to each of the gate electrodes, respectively, the active layers being formed into an integrated structure;
a source electrode connected with one of the plurality of active layers; and
a plurality of drain electrodes connected with each of the rest of the plurality of active layers, respectively, the plurality of drain electrodes being not connected to each other directly, and the active layers being provided between the drain electrodes,
wherein, when the multi-gate thin film transistor is turned on, the multi-gate thin film transistor is equivalent to at least two double-gate thin film transistors, and when the multi-gate thin film transistor is turned off, there is no signal crosstalk between the plurality of drain electrodes of the multi-gate thin film transistor,
wherein the at least three gate electrodes comprise a first gate electrode, a second gate electrode, a third gate electrode and a fourth gate electrode, and
wherein the plurality of active layers comprise a first active layer, a second active layer, a third active layer and a fourth active layer corresponding to the first gate electrode, the second gate electrode, the third gate electrode and the fourth gate electrode, respectively.

2. The multi-gate thin film transistor according to claim 1, wherein the first gate electrode, the second gate electrode, the gate electrode layer and the fourth gate electrode form a square structure, and
the first active layer, the second active layer, the third active layer and the fourth active layer form a cross-shaped structure.

3. The multi-gate thin film transistor according to claim 1, wherein the first active layer, the second active layer, the third active layer and the fourth active layer form a square structure, and
the first gate electrode, the second gate electrode, the third gate electrode and the fourth gate electrode form a cross-shaped structure.

4. An array substrate, comprising the multi-gate thin film transistor according to claim 1.

5. The array substrate according to claim 4, further comprising a plurality of gate lines, a plurality of data lines and a plurality of pixel units provided with pixel electrode, wherein one data line is provided between every two adjacent rows of pixel units,
the multi-gate thin film transistor is located between at least two adjacent pixel units, each of the gate electrodes in the multi-gate thin film transistor is connected with the same gate line, the source electrode is connected with the data line, and each of the drain electrodes is connected with the pixel electrode of each of the at least two adjacent pixel units.

6. The array substrate according to claim 5, wherein each of the gate electrodes, each of the active layers and each of the drain electrodes in the multi-gate thin film transistor are located at the same side of the gate line connected with each of the gate electrodes, and the source electrode in the multi-gate thin film transistor is located at the other side of the gate line.

7. A display device, comprising the array substrate according to claim 4.

8. The display device according to claim 7, wherein the array substrate further comprises a plurality of gate lines, a plurality of data lines and a plurality of pixel units provided with pixel electrode, wherein one data line is provided between every two adjacent rows of pixel units, the multi-gate thin film transistor is located between at least two adjacent pixel units, each of the gate electrodes in the multi-gate thin film transistor is connected with the same gate line, the source electrode is connected with the data line, and each of the drain electrodes is connected with the pixel electrode of each of the at least two adjacent pixel units.

9. The display device according to claim 8, wherein each of the gate electrodes, each of the active layers and each of the drain electrodes in the multi-gate thin film transistor are located at the same side of the gate line connected with each of the gate electrodes, and the source electrode in the multi-gate thin film transistor is located at the other side of the gate line.

* * * * *